(12) United States Patent
Haraguchi et al.

(10) Patent No.: US 7,084,700 B2
(45) Date of Patent: Aug. 1, 2006

(54) DIFFERENTIAL VOLTAGE AMPLIFIER CIRCUIT

(75) Inventors: Akira Haraguchi, Kasugai (JP); Takashi Matsumoto, Kasugai (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 11/088,938

(22) Filed: Mar. 25, 2005

(65) Prior Publication Data

US 2005/0218976 A1  Oct. 6, 2005

Related U.S. Application Data

(63) Continuation of application No. PCT/JP03/04929, filed on Apr. 17, 2003.

(51) Int. Cl.
*H03F 1/02* (2006.01)
(52) U.S. Cl. .......................................... 330/9
(58) Field of Classification Search ............ 330/9, 330/51; 327/124, 307
See application file for complete search history.

(56) References Cited

U.S. PATENT DOCUMENTS 4,890,014 A * 12/1989 Ramet ..................... 327/307
6,087,897 A * 7/2000 Wang ........................ 330/9

FOREIGN PATENT DOCUMENTS

| JP | 60-203008 | 10/1985 |
|----|-----------|---------|
| JP | 04-097608 | 3/1992 |
| JP | 05-063527 | 3/1993 |
| JP | 07-191110 | 7/1995 |
| JP | 08-018353 | 1/1996 |
| JP | 2000-004129 | 1/2000 |
| JP | 2001-244759 | 9/2001 |

* cited by examiner

*Primary Examiner*—Khanh Van Nguyen
(74) *Attorney, Agent, or Firm*—Arent Fox PLLC

(57) ABSTRACT

The present invention aims to provide a differential voltage amplifier circuit capable of preventing narrowing of an input voltage allowable range, making unnecessary the calculation of correction by an MPU or the like, reducing an influence due to a change in temperature and detecting a high-accuracy differential voltage. Upon a short circuit between input paths, an output voltage of a differential amplifier at the short circuit therebetween is held in a capacitor. Upon differential voltage amplification, a subtraction circuit section performs a process for subtraction between the output voltage held in the capacitor and a bias voltage. An output voltage is applied to a bias voltage terminal, and an output voltage obtained by multiplying the difference between input voltages by an amplification factor AV with the applied output voltage as the reference is outputted via an output terminal for a differential voltage amplifier circuit section.

13 Claims, 7 Drawing Sheets

DIFFERENTIAL VOLTAGE AMPLIFIER CIRCUIT

CROSS-REFERENCE TO RELATED APPLICATIONS

This application is a continuation application based upon and claims the benefit of the prior PCT International Patent Application No. PCT/JP2003/004929 filed on Apr. 17, 2003, the entire contents of which are incorporated herein by reference.

BACKGROUND OF THE INVENTION

1. Field of the Invention

The present invention relates to cancellation of an input offset voltage applied to a differential voltage amplifier circuit, and particularly to a differential voltage amplifier circuit capable of obtaining high accuracy detection of a differential voltage.

2. Description of the Related Art

There has recently been an increasingly demand for a high accuracy current detecting means. For example, various portable electronic equipments such as a notebook personal computer, etc. need to bring the measurement of a remaining capacity of a second battery to high precision. For that purpose, the high accuracy current detecting means is required.

A technique disclosed in Japanese Unexamined Patent Publication No. 7(1995)-191110 will be explained using FIG. 7 as a related art. A circuit according to the related art shown in FIG. 7 is equipped with a sense resistor 102 which detects charge and discharge currents from a secondary battery 101, a differential voltage amplifier circuit 104 which amplifies a terminal voltage applied across the sense resistor 102, and a switch 103 which short-circuits two input terminals of the differential voltage amplifier circuit 104 to temporarily bring an input difference voltage to zero. A microcontroller 105 includes an A/D converter 107, a current detection circuit 108, a remaining capacity arithmetic circuit 109 and a switch control circuit 110.

The output of the differential voltage amplifier circuit 104 at the time that the switch 103 short-circuits the two input terminals of the differential voltage amplifier circuit 104 to bring the input difference voltage to zero, is converted into a digital value by the A/D converter 107, which in turn is determined as an offset voltage value in advance and stored. Then, a value obtained by adding or subtracting the previously-determined offset voltage value to and from an output voltage value of the differential voltage amplifier circuit 104 at the time of amplification of the terminal voltage of the sense resistor 102, is used as a value corresponding to the charge or discharge current. The remaining capacity arithmetic circuit 109 performs an arithmetical operation on the remaining capacity. It is thus possible to reduce an error in the result of the arithmetical operation on the remaining capacity of the secondary battery 101 due to the offset voltage.

In the method for detecting the input offset voltage value of the differential voltage amplifier circuit and adding and subtracting it to and from the output voltage value to thereby perform correction on the result of detection as described in the related art, the input offset voltage value is contained in the input voltage value of the differential voltage amplifier circuit. As a result, the originally provided input voltage allowable range of the differential voltage amplifier circuit is shifted by the input offset voltage. Thus, a range obtained by subtracting a range occupied by the input offset voltage therefrom results in the input voltage allowable range of the differential voltage amplifier circuit in the related art. Therefore, the measurement range is limited since the input voltage allowable range used for measurement is narrowed, thus causing a problem such as a reduction in accuracy of measurement.

When the input offset voltage changes due to temperatures, an error occurs between an output voltage value calculated for correction and an actual differential voltage, depending on measured temperatures. Since the remaining capacity of the battery is calculated on the basis of the integrated output voltage value, the measured error is also integrated and hence the error between the calculated remaining capacity of the battery and the value of an actual remaining capacity of the battery becomes large to such an innegligible extent, thus causing a problem. In order to avoid such a problem, allowance is made for the remaining capacity of the battery and there is no other choice but to issue a warning against a shortage of remaining capacity. Thus, a problem arises in that the capacity of the battery cannot be used to the full. When the input offset voltage value is measured for each differential voltage measurement, an increase in burden on an MPU, an increase in current consumption, etc. occur, thus causing a problem.

Since the input offset voltage value is being contained in the input differential voltage of the differential voltage amplifier circuit, it is necessary to perform correction calculation for eliminating the influence of the offset voltage value from the input differential voltage for each differential voltage measurement. Therefore, the MPU needs to perform arithmetic processing every correction calculations. Hence its control is cumbersome and current consumption also becomes large, thus causing a problem.

Since the input offset voltage is stored in the MPU, it is necessary to perform a test to calculate the input offset voltage and store it in the MPU under a high-precision measurement environment. Therefore, a problem that a testing device becomes large in scale, and a problem that testing becomes expensive arise, thus causing problems.

SUMMARY OF THE INVENTION

The present invention has been made to solve at least one of the problems of the related art. It is an object of the present invention to provide a differential voltage amplifier circuit capable of preventing narrowing of an input voltage allowable range, making unnecessary the calculation of correction by an MPU or the like, reducing an influence due to a change in temperature and detecting a high-accuracy differential voltage.

In order to attain the above object, there is provided a differential voltage amplifier circuit provided with a first differential amplifier, according to a first aspect of the invention, comprising a first switch section which short-circuits between input paths corresponding to a first input path from a first input terminal to the first differential amplifier and a second input path from a second input terminal to the first differential amplifier, a voltage holder which holds a short-circuit output voltage outputted from the first differential amplifier upon a short-circuit between the input paths, a second switch section which connects an output terminal of the first differential amplifier and the voltage holder upon holding the short-circuit output voltage, a subtraction circuit section which performs subtraction between the short-circuit output voltage held in the voltage holder and a first reference voltage, and a third switch section which supplies the first reference voltage to a bias voltage terminal for setting a bias point of an input voltage of the first differential amplifier upon the short-circuit between the input paths and supplies an output of the subtraction circuit section as a second reference voltage upon differential voltage amplification.

In the differential voltage amplifier circuit, the first and second switch sections are brought into conduction upon the short-circuit between the input paths and hence the first reference voltage is supplied to the bias voltage terminal by the third switch section. Thus, the input offset voltage of the first differential amplifier is retained in the voltage holder. Upon the differential voltage amplification, the first and second switch sections are brought into non-conduction, and hence the output of the subtraction circuit section is supplied to the bias voltage terminal as the second reference voltage by the third switch section.

Thus, the input offset voltage value of the differential voltage amplifier circuit can be canceled. Consequently, an input voltage allowable range of the differential voltage amplifier circuit is not narrowed due to the influence of the input offset voltage and hence a reduction in accuracy of measurement can be prevented.

Thus, even when the input offset voltage of the differential voltage amplifier circuit changes due to temperatures, the input offset voltage value can be canceled following its change. Thus, since a voltage measurement improved in accuracy as compared with the method for measuring a voltage value by the conventional correction calculation is enabled, the remaining capacity of the battery can be measured more accurately.

Thus, an MPU needs not to perform correction calculation for eliminating the influence of the input offset voltage value, every differential voltage measurements. Consequently, its control can be simplified and current consumption can be reduced.

Thus, since it is not necessary to store the input offset voltage into the MPU, there is no need to perform a test to calculate the input offset voltage and store it in the MPU under a high-precision measurement environment, and the like. Therefore, a testing device can be simplified and the test can be done at low cost.

There is also provided a differential voltage amplifier circuit provided with a differential amplifier, according to a second aspect of the invention, comprising a voltage holder which holds a short-circuit output voltage outputted from the differential amplifier where a short circuit is developed between two input paths to the differential amplifier, and a bias voltage setting section which sets a bias point of an input voltage of the differential amplifier, wherein the bias voltage setting section sets a first reference voltage upon the short-circuit between the input paths and sets a voltage corresponding to a difference between the short-circuit output voltage held in the voltage holder and the first reference voltage upon differential voltage amplification.

Thus, an input offset voltage value of the differential voltage amplifier circuit can be canceled. Therefore, an input voltage allowable range of the differential voltage amplifier circuit is not narrowed due to the influence of the input offset voltage and hence a reduction in accuracy of measurement can be prevented. Even when the input offset voltage of the differential voltage amplifier circuit changes due to temperatures, the input offset voltage value can be canceled following its change.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

The accompanying drawings, which are incorporated in and constitute a part of this specification illustrate an embodiment of the invention and, together with the description, serve to explain the objects, advantages and principles of the invention.

In the drawings.

DETAILED DESCRIPTION OF THE PREFERRED EMBODIMENTS

Preferred embodiments of a differential voltage amplifier circuit of the present invention will hereinafter be described in detail with reference to the figures on the basis of FIGS. 1 through 5.

Figure 1:
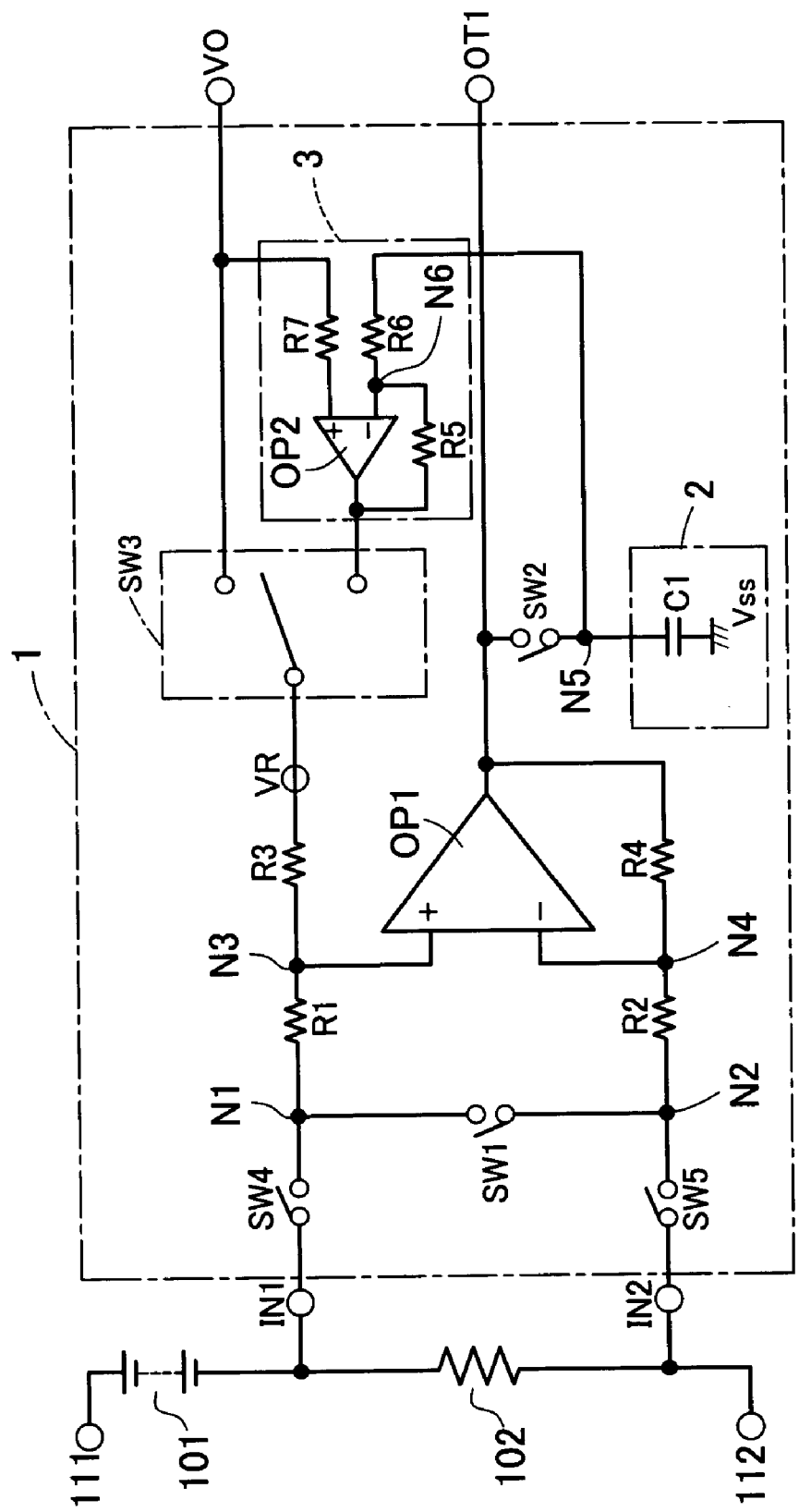
FIG. 1 is a circuit diagram in a first embodiment.

A first embodiment will be explained using a circuit diagram shown in FIG. 1. FIG. 1 is a circuit diagram showing a secondary battery pack equipped with a differential voltage amplifier circuit according to the present invention. The secondary battery pack is provided with a secondary battery 101, a sense resistor 102, secondary battery terminals 111 and 112, and a differential voltage amplifier circuit section 1.

The secondary battery pack is configured so as to be detachably mounted to devices to be used corresponding to a battery charger and a load. The secondary battery pack is operated in such a manner that when the charger is connected to the terminals 111 and 112, a charge current flows through the battery 101, and when the load is connected across the terminals 111 and 112, a discharge current flows through the battery 101. In order to obtain sufficient voltages across the secondary battery 101 and the secondary battery terminals 111 and 112 with respect to the charge and discharge currents, the sense resistor 102 on a current path is generally set to a low resistance.

The differential voltage amplifier circuit section 1 amplifies a small differential voltage obtained when the charge and discharge currents flow through the sense resistor 102. Then, the differential voltage amplifier circuit section 1 is equipped with an input terminal IN1, an input terminal IN2, a bias voltage input terminal VO, and an output terminal OT1 for the differential voltage amplifier circuit section. The differential voltage amplifier circuit section 1 is provided thereinside with a voltage holder 2, a subtraction circuit section 3, a differential or operational amplifier OP1, resistors R1 through R4, switches SW1 through SW5, and a bias voltage terminal VR. The voltage holder 2 is provided with a condenser C1, and the subtraction circuit section 3 is provided with a differential amplifier OP2 and resistors R5 through R7. The resistors R1 through R7 respectively have resistance values RR1 through RR7. They are values having a relationship of RR1=RR2, RR3=RR4, RR5=RR6=2×RR7.

The input terminal IN1 and the input terminal IN2 are connected across the sense resistor 102. The input terminal IN1 is connected via the switch SW4 to one ends of the resistor R1 and the switch SW1 at a node N1. The input terminal IN2 is connected via the switch SW5 to the other ends of the resistor R2 and the switch SW1 at a node N2.

One end of the resistor R3 is connected to the bias voltage terminal VR, and one end of the resistor R4 is connected to the output of the differential amplifier OP1. The resistor R1 and the resistor R3 are connected to each other at a node N3 and then connected to a non-inversion input terminal of the differential amplifier OP1. The resistor R2 and the resistor R4 are connected to each other at a node N4 and then connected to an inversion input terminal of the differential amplifier OP1. The output of the differential amplifier OP1 is inputted to the resistor R4, the switch SW2 and the output terminal OT1. The output terminal OT1 is connected to a battery remaining capacity calculating section (not shown), where the remaining capacity of the battery is calculated on the basis of the result of measurement by the differential voltage amplifier circuit section 1.

One end of the capacitor C1 of the voltage holder 2 is set as a ground voltage Vss, whereas the other end (node N5) thereof is connected to the switch SW2 and the resistor R6. The subtraction circuit section 3 is provided with the resistor R5 inputted with the output of the differential amplifier OP2. The resistor R5 and the resistor R6 are connected to each other at a node N6. The node N6 is connected to an inversion input terminal of the differential amplifier OP2. On the other hand, the bias voltage input terminal VO is connected via the resistor R7 to a non-inversion input terminal of the differential amplifier OP2. The switch SW3 is connected so as to be able to switch between the output of the subtraction circuit section 3 and the bias voltage input terminal VO and connected to the bias voltage terminal VR.

Incidentally, the subtraction circuit section 3 and the switch SW3 constitute a bias voltage setting section which sets a bias point of a voltage inputted to the differential amplifier OP1.

Input voltages VIN1 and VIN2 are applied to the input terminals IN1 and IN2, and a bias voltage VO1 is applied to the bias voltage input terminal VO. The output of the differential amplifier OP1 at a short-circuit between input paths, the output of the differential amplifier OP1 at differential voltage amplification, the output of the differential amplifier OP2, and input offset voltages of the differential amplifiers OP1 and OP2 are defined as an output voltage VOUT1, an output voltage VOUT1A, an output voltage VOUT2, and VOFF1 and VOFF2, respectively.

The operation of the first embodiment at the short-circuit between the input paths will be explained. This operation is equivalent to the operation of, prior to the operation of amplifying a differential voltage, causing the voltage holder 2 to hold or retain the input offset voltage VOFF1 of the differential amplifier OP1. Upon the short-circuit between the input paths, the switches SW1 and SW2 are brought into conduction and the switches SW4 and SW5 are brought into non-conduction. Also the switch SW3 connects the bias voltage terminal VR and the bias voltage input terminal VO.

The voltage applied to each of the nodes N1 and N2 when the switch SW1 is in a connected state, is defined as a short-circuit voltage VINR. The bias voltage VO1 is applied to the bias voltage terminal VR. At this time, a voltage divided by the resistors R1 and R3 is applied to the node N3, and the value of the applied voltage is expressed in the following equation (1) with the node N1 as the reference:

$$(VO1-VINR) \times RR1/(RR1+RR3) \tag{1}$$

Similarly, a voltage divided by the resistors R2 and R4 is applied to the node N4, and the value of the applied voltage is expressed in the following equation (2) with the node N2 as the reference:

$$(VOUT1-VINR) \times RR2/(RR2+RR4) \tag{2}$$

Since the inversion input terminal and non-inversion input terminal of the differential amplifier OP1 become identical to each other in voltage, the following equation (3) is established in consideration of the input offset voltage VOFF1:

$$(VO1-VINR) \times RR1/(RR1+RR3)+VOFF1=(VOUT1-VINR) \times RR2/(RR2+RR4) \tag{3}$$

Arranging the equation (3) using the relationship between RR1=RR2 and RR3=RR4 yields the following equation (4):

$$VOUT1=VO1+(1+RR4/RR2) \times VOFF1 \tag{4}$$

where the gain or amplification factor is defined as AV=RR4/RR2. When consideration is given to the fact that AV is sufficiently larger than 1, then the output voltage VOUT1 of the differential amplifier OP1 at the short-circuit between the input paths is expressed in the following equation (5):

$$VOUT1=VO1+AV \times VOFF1 \tag{5}$$

Since the switch SW2 is held in conduction, the capacitor C1 is charged up to the voltage corresponding to the output voltage VOUT1. Even when the switch SW2 is brought into non-connection, the voltage is held.

The operation of the first embodiment at the differential voltage amplification will next be explained. Upon the differential voltage amplification, the switches SW1 and SW2 are brought into non-conduction and the switches SW4 and SW5 are brought into conduction. The switch SW3 connects the bias voltage terminal VR and the output of the subtraction circuit section 3.

The voltage VOUT1 obtained in the equation (5) is held at the node N5. At this time, a voltage divided by the resistors R5 and R6 is applied to the node N6, and the value of the applied voltage is expressed in the following equation (6):

$$(VOUT2-VOUT1) \times RR6/(RR5+RR6)+VOUT1 \tag{6}$$

Since the bias voltage VO1 is applied to the non-inversion input terminal of the differential amplifier OP2, the following equation (7) is established in consideration of the input offset voltage VOFF2 of the differential amplifier OP2:

$$VO1+VOFF2=(VOUT2-VOUT1) \times RR6/(RR5+RR6)+VOUT1 \tag{7}$$

Since RR5=RR6, the following equation (8) is obtained when the equation (7) is arranged:

$$VOUT2=2VO1-VOUT1+2 \times VOFF2 \tag{8}$$

Substituting the equation (5) in VOUT1 of the equation (8) yields the following equation (9):

$$VOUT2=VO1-AV \times VOFF1+2 \times VOFF2 \tag{9}$$

Since the switches SW4 and SW5 are held in conduction, the input voltages VIN1 and VIN2 are respectively applied to the nodes N1 and N2. Further, the output voltage VOUT2 of the differential amplifier OP2 is applied to the bias voltage terminal VR. Thus, the output voltage VOUT1A of the differential amplifier OP1 at the differential voltage amplification is obtained in a manner similar to the equation (3), which is expressed in the following equation (10):

$$(VOUT2-VIN1) \times RR1/(RR1+RR3)+VOFF1+VIN1 = (VOUT1A-VIN2) \times RR2/(RR2+RR4)+VIN2 \quad (10)$$

Arranging the equation (3) using the relationship between RR1=RR2 and RR3=RR4 and using the amplification factor or gain AV yields the following equation (11):

$$VOUT1A=VOUT2+AV \times (VIN1-VIN2)+(AV+1) \times VOFF1 \quad (11)$$

Since the amplification factor AV>>1 in the equation (11), (AV+1) can be regarded as AV. Substituting the equation (9) in VOUT2 of the equation (11) yields the following equation (12):

$$VOUT1A=VO1+AV \times (VIN1-VIN2)+2 \times VOFF2 \quad (12)$$

Thus, it is understood from the equation (12) that the influence of the input offset voltage VOFF1 of the differential amplifier OP1, which is multiplied by the amplification factor AV, is eliminated. Since the input offset voltage VOFF2 of the differential amplifier OP2 is not multiplied by the amplification factor AV (the value of 100 or the like might be used as AV), the influence of the term (2×VOFF2) of the input offset voltage VOFF2 is negligible because it is small as compared with other terms. Thus, the following equation (13) is obtained:

$$VOUT1A=VO1+AV \times (VIN1-VIN2) \quad (13)$$

Then, the output voltage VOUT1A at the differential voltage amplification, of the differential amplifier OP1, which is obtained at the equation (13), is outputted via the output terminal OT1. That is, the output voltage VOUT1A is outputted which has a bias point adjusted by the bias voltage VO1 applied to the bias voltage input terminal VO and is obtained by multiplying the difference between the input voltages VIN1 and VIN2 by the amplification factor AV without being affected by the input offset voltage VOFF1.

Thus, the input offset voltage VOFF1 of the differential amplifier OP1 can be canceled. It is therefore possible to avoid narrowing of such an input voltage allowable range that the differential voltage amplifier circuit is capable of differential amplification, due to the multiplication of the input offset voltage by AV, and prevent a reduction in the accuracy of measurement. Also the AV multiplication can be set higher.

Thus, even when the input offset voltage VOFF1 of the differential amplifier OP1 changes due to temperatures, the input offset voltage VOFF1 can be canceled following its change. Thus, since a voltage measurement improved in accuracy as compared with the method for measuring a voltage value by the conventional correction calculation is enabled, the remaining capacity of the battery can be measured more accurately.

Thus, the MPU needs not to perform correction calculation for eliminating the influence of the input offset voltage VOFF1, every differential voltage measurements as compared with the prior art. Consequently, its control can be simplified and current consumption made with the differential voltage measurements can be reduced. Since it is not necessary to store the input offset voltage VOFF1 into the MPU, there is no need to perform a test to calculate the input offset voltage VOFF1 and store it in the MPU under a high-precision measurement environment, and the like. Therefore, a testing device can be simplified and the test can be done at low cost.

It is possible to perform the operation of short-circuiting between the input paths in a predetermined cycle during the operation at the differential voltage amplification. That is, the output voltage VOUT1 of the differential amplifier OP1, which is retained in the capacitor C1, can be updated on a regular basis.

Thus, the input offset voltage VOFF1 can be updated on a regular basis, and the input offset voltage VOFF1 can be canceled following a change in offset with time due to temperatures or the like. Consequently, a voltage value more improved in precision as compared with the voltage value determined by the conventional correction calculation can be measured.

With the non-conduction of the switches SW4 and SW5 at the short-circuit between the input paths, the input offset voltage VOFF1 can be measured in a state in which the differential voltage amplifier circuit section 1 is being separated from an external circuit.

Figure 2:
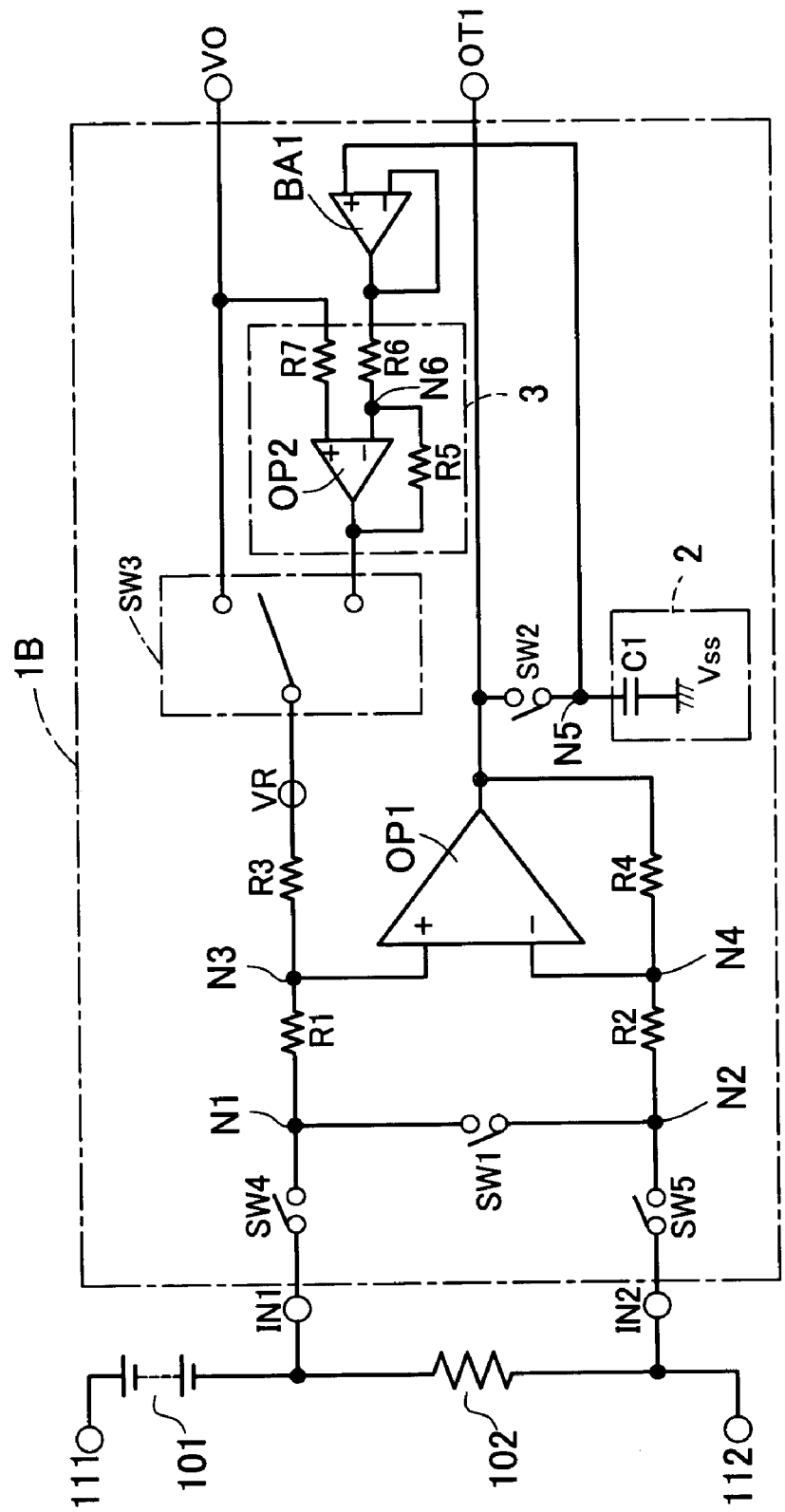
FIG. 2 is a circuit diagram in a second embodiment.

A second embodiment will be explained using FIG. 2. A differential voltage amplifier circuit section 1B shown in FIG. 2 is equipped with a buffer amplifier BA1 connected between the capacitor C1 of the voltage holder 2 and the resistor 6 of the subtraction circuit section 3, in addition to the differential voltage amplifier circuit section 1 of the first embodiment. Since the operations of the second embodiment at a short-circuit between input paths and differential voltage amplification are similar to the first embodiment, their detailed description is omitted.

Upon the differential voltage amplification, the output voltage VOUT1 retained in the capacitor C1 is inputted to the subtraction circuit section 3 via the buffer amplifier BA1. At the subtraction circuit section 3, a current that flows via the resistors 5 and 6 is supplied from the buffer amplifier BA1 and not supplied from the capacitor C1. Thus, the voltage held in the capacitor C1 is maintained at a constant value.

On the other hand, when the buffer amplifier BA1 is not provided, the capacitor C1 is discharged to the resistor R6 during the operation at the differential voltage amplification. Since, at this time, the hold voltage of the capacitor C1 is reduced and hence an error occurs in the output of the differential amplifier OP2, a high-accuracy output voltage VOUT1A cannot be obtained. When the capacitance of the capacitor C1 is set large in order to avoid the above problem, problems such as an increase in circuit occupied area of the capacitor C1, etc. arise.

Thus, the provision of the buffer amplifier BA1 makes it possible to hold constant the hold voltage of the voltage holder 2 regardless of the magnitude of the capacitance of the capacitor C1 of the voltage holder 2. Consequently, a higher-accuracy output voltage VOUT1A can be obtained. Since the capacitance of the capacitor C1 of the voltage holder 2 can be made smaller, the circuit occupied area of the capacitor C1 can be reduced.

Figure 3:
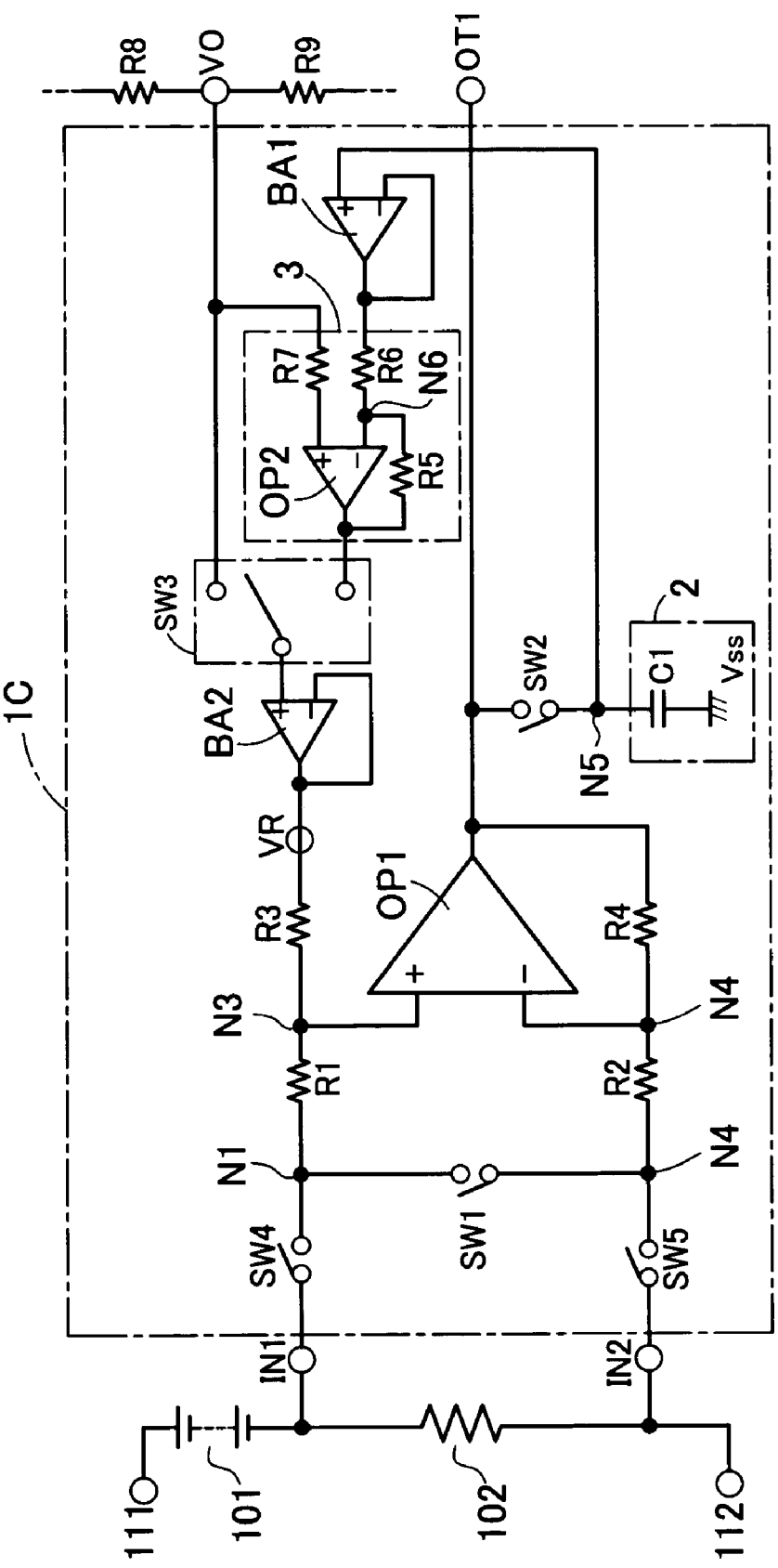
FIG. 3 is a circuit diagram in a third embodiment.

A third embodiment will be explained using FIG. 3. A differential voltage amplifier circuit section 1C shown in FIG. 3 is provided with a buffer amplifier BA2 connected between the switch SW3 and the bias voltage terminal VR, in addition to the differential voltage amplifier circuit section 1B of the second embodiment. Further, resistors R8 and R9 are connected to the bias voltage input terminal VO. The bias voltage VO1 applied to the bias voltage input terminal VO is a voltage divided by the resistors R8 and R9. Since the operation of the differential voltage amplifier circuit section 1C is similar to the first embodiment, its detailed description is omitted.

Upon the short-circuit between the input paths, the bias voltage VO1 is applied to the resistor R3 via the buffer amplifier BA2 and the bias voltage terminal VR. Accordingly, a current that flows via the resistors R1 and R3 is supplied from the buffer amplifier BA2. Thus, the bias voltage VO1 is maintained at a constant value.

On the other hand, when the buffer amplifier BA2 is not provided, the bias voltage VO1 corresponding to the divided voltage changes due to the current flowing into the resistors R1 and R3. As a result, a problem arises that a high-accuracy output voltage VOUT1A is not obtained.

Thus, owing to the provision of the buffer amplifier BA2, the current flowing through the resistors R1 and R3 no longer flows into the bias voltage input terminal VO. Thus, since the bias voltage VO1 remains unchanged, the result of a high-accuracy differential voltage measurement can be obtained. Further, such a circuit configuration that the external offset voltage VO1 is generated from a point of resistance division, etc. can be made. A method for generating the external offset voltage VO1 can freely be set.

Figure 4:
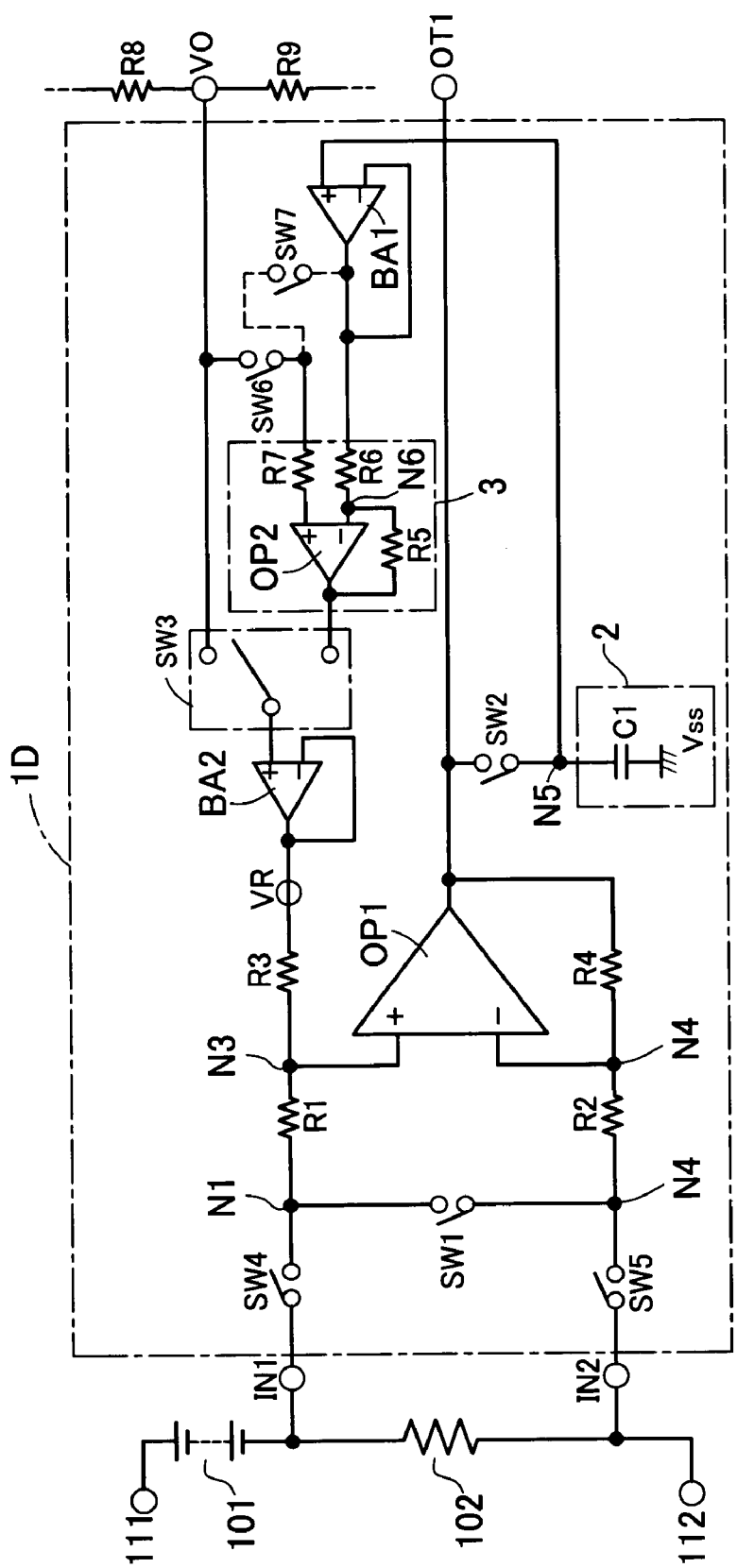
FIG. 4 is a circuit diagram in a fourth embodiment.

A fourth embodiment will be explained using FIG. 4. A differential voltage amplifier circuit section 1D shown in FIG. 4 is provided with a switch SW6 connected between the bias voltage input terminal VO and the resistor R7, in addition to the differential voltage amplifier circuit section 1C of the third embodiment. Since the operation of the differential voltage amplifier circuit section 1D is similar to the differential voltage amplifier circuit section 1 employed in the first embodiment, its detailed description is omitted.

Upon a short-circuit between input paths, the switch SW6 is brought into non-conduction. The bias voltage VO1 is applied to a non-inversion input terminal of the buffer amplifier BA2 via the switch SW3. Upon differential voltage amplification, the switch SW6 is brought into conduction and hence the switch SW3 connects the non-inversion input terminal of the buffer amplifier BA2 and the output of the subtraction circuit section 3. Therefore, the bias voltage VO1 is applied to the non-inversion input terminal of the differential amplifier OP2 via the switch SW6.

On the other hand, when the switch SW6 is not provided, the bias voltage VO1 is applied to both the buffer amplifier BA2 and the differential amplifier OP2 upon the short-circuit between the input paths, whereas upon the differential voltage amplification, the bias voltage VO1 is applied only to the differential amplifier OP2. Thus, the number of terminals connected to the bias voltage input terminal VO differ between the short-circuit and the differential voltage amplification, and the amounts of inputted and outputted currents differ therebetween. Therefore, a problem arises in that the bias voltage VO1 changes and hence a high-accuracy output voltage VOUT1A is not obtained.

Thus, owing to the provision of the switch SW6, the bias voltage VO1 is applied only to the buffer amplifier BA2 upon the short-circuit between the input paths, whereas the bias voltage VO1 is applied only to the differential amplifier OP2 upon the differential voltage amplification, thereby allowing terminals to be connected to coincide in number with each other upon the short-circuit and the amplification. Consequently, the difference between the inputted and outputted currents is reduced. Thus, a change in the bias voltage VO1 can be suppressed and a high-accuracy output voltage VOUT1A can be obtained. Such a circuit configuration that the bias voltage VO1 is generated from a point of resistance division, etc. can be taken. A method for generating the bias voltage VO1 can freely be set.

Incidentally, a switch SW7 brought into conduction upon the short-circuit between the input paths and brought into non-conduction upon the differential voltage amplification can be provided in a path that extends from the buffer amplifier BA1 to the resistor R6. Thus, a path extending from the switch SW6 to the non-inversion input terminal of the differential amplifier OP2 can be prevented from being brought into a floating state upon the short-circuit between the input paths.

Figure 5:
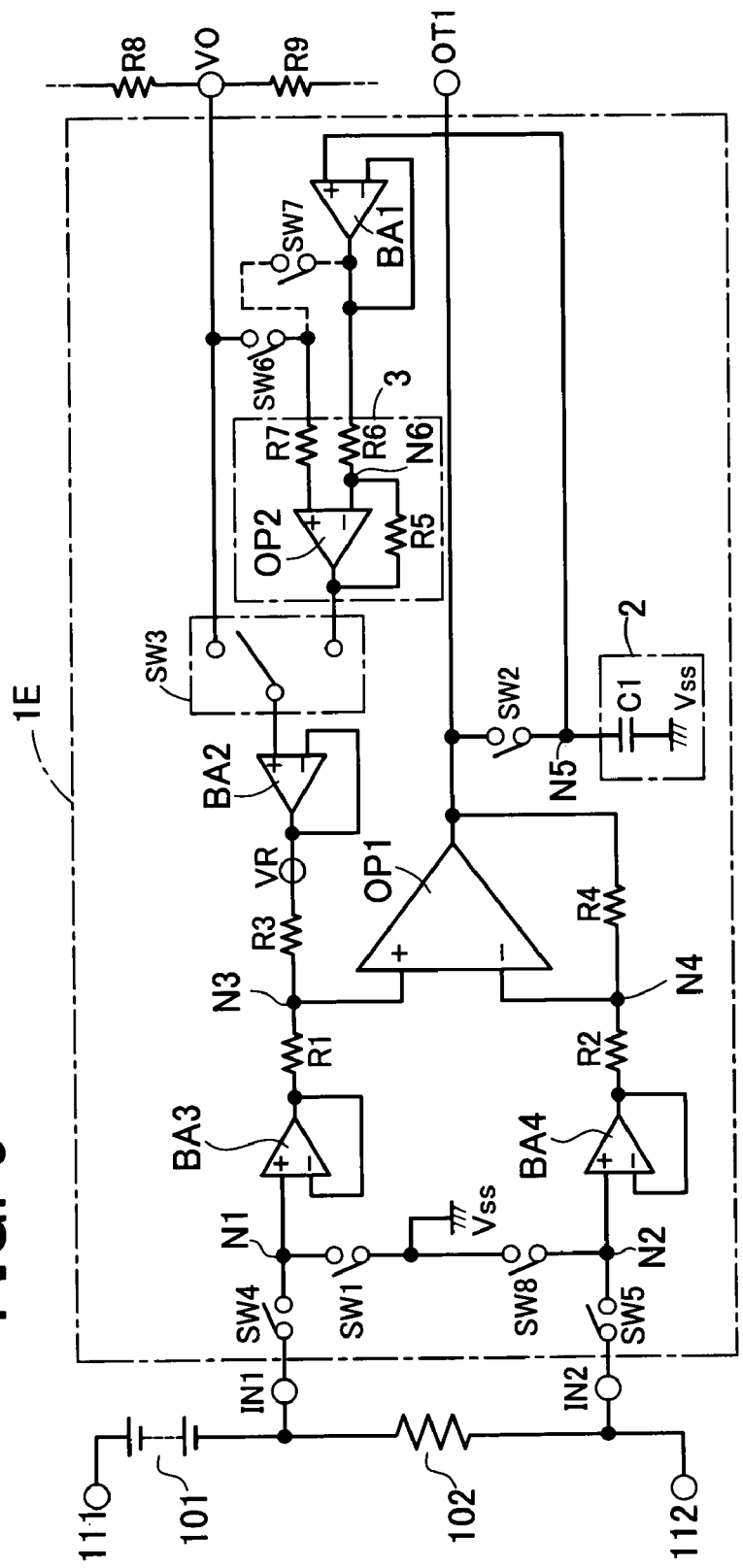
FIG. 5 is a circuit diagram in a fifth embodiment.

A fifth embodiment will be explained using FIG. 5. A differential voltage amplifier circuit section 1E shown in FIG. 5 is provided with a buffer amplifier BA3 connected between the input terminal IN1 and the resistor R1 and a buffer amplifier BA4 connected between the input terminal IN2 and the resistor R2, in addition to the differential voltage amplifier circuit section 1D of the fourth embodiment. Further, the node N1 is connected to a ground voltage Vss via the switch SW1, whereas the node N2 is connected to the ground voltage Vss via a switch SW8. Since the operation of the differential voltage amplifier circuit section 1E is similar to the differential voltage amplifier circuit section 1 employed in the first embodiment, its detailed description is omitted.

Upon a short-circuit between input paths, the switches SW4, SW5 and SW6 are brought into non-conduction, and the switches SW1, SW2 and SW8 are brought into conduction. The switch SW3 is connected to the bias voltage terminal VR and the bias voltage input terminal VO. With the conduction of the switches SW1 and SW8 at this time, the resistors R1 and R2 are connected to the ground voltage Vss via the buffer amplifiers BA3 and BA4 respectively.

Upon differential voltage amplification, the switches SW4, SW5 and SW6 are brought into conduction, and the switches SW1, SW2 and SW8 are brought into non-conduction. The switch SW3 connects the non-inversion input terminal of the buffer amplifier BA2 and the output of the subtraction circuit section 3. Since, at this time, currents that flow via the resistors R1 and R2 are supplied from the buffer amplifiers BA3 and BA4 respectively, each of the input voltages VIN1 and VIN2 is maintained at a constant value. On the other hand, when the buffer amplifiers BA3 and BA4 are not provided, the input voltages VIN1 and VIN2 change when the currents flow through the resistors R1 and R2. As a result, a problem arises in that a high-accuracy output voltage VOUT1A is not obtained. Thus, the result of a high-accuracy differential voltage measurement can be obtained by providing the buffer amplifiers BA3 and BA4.

Figure 6:
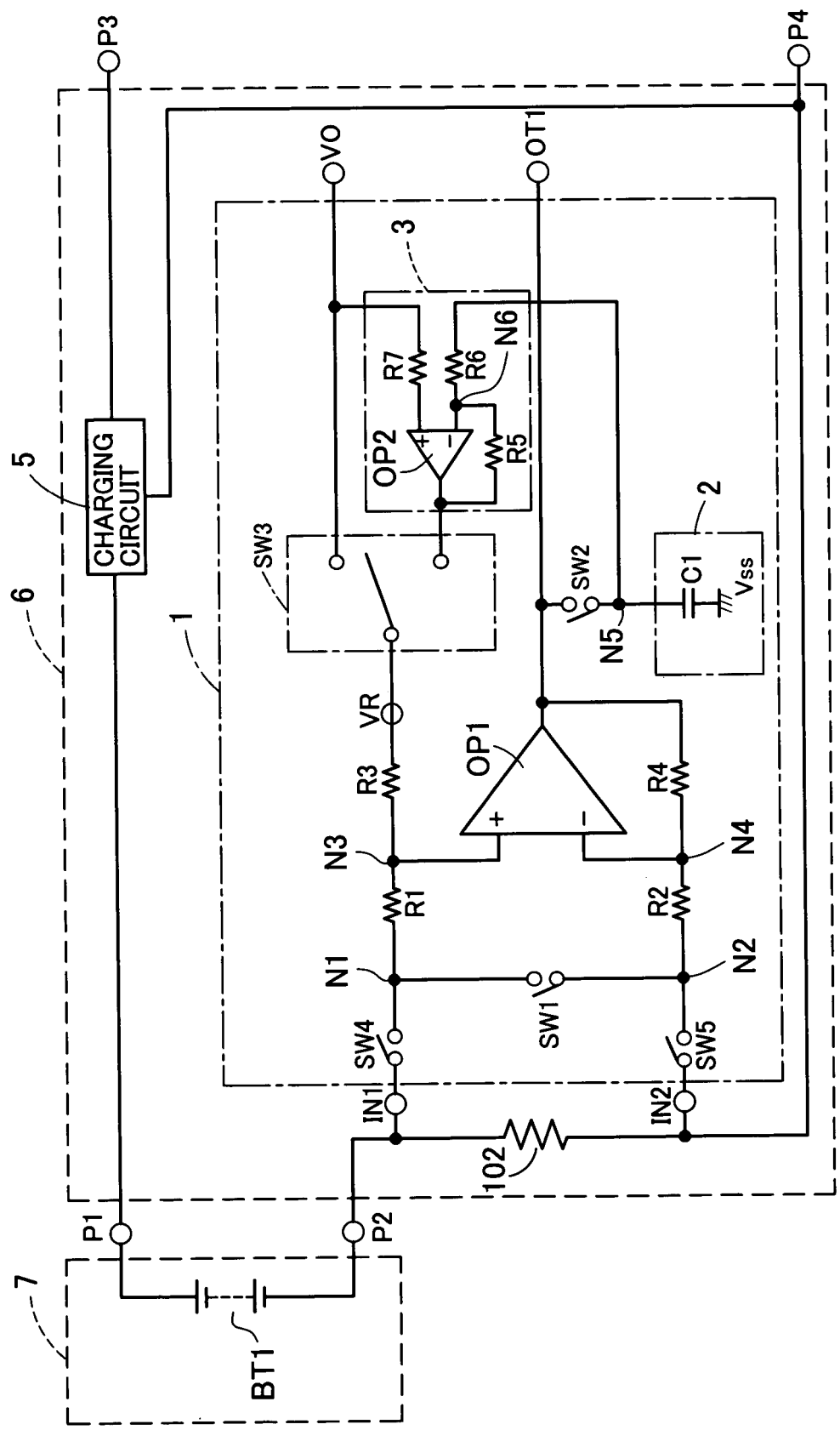
FIG. 6 is a circuit diagram in a sixth embodiment.
Figure 7:
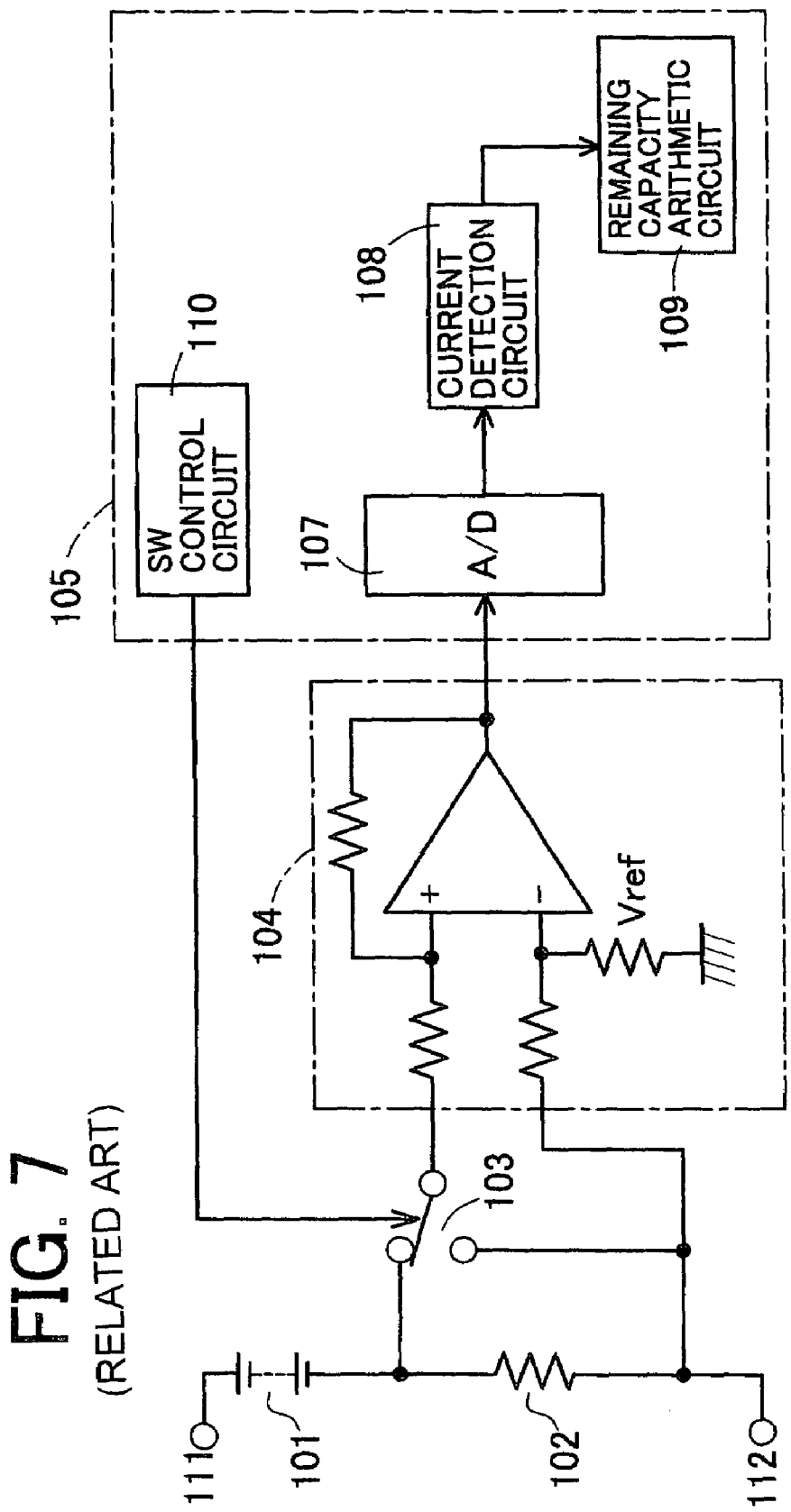
FIG. 7 is a circuit diagram in a related art.

A sixth embodiment will be explained using FIG. 6. FIG. 6 is a circuit diagram showing a secondary battery charger 6 provided with a differential voltage amplifier circuit section 1 according to the present invention. The secondary battery charger 6 includes a charging circuit 5 and terminals P1 through P4 in addition to the differential voltage amplification circuit section 1, the input terminals IN1 and IN2, the bias voltage input terminal VO, the output terminal OT1 for the differential voltage amplifier circuit section, and the sense resistor 102. Since the operation of the differential voltage amplifier circuit section 1 is similar to the first embodiment, its detailed description is omitted.

A battery pack 7 provided with a secondary battery BT1 is connected to the secondary battery charger 6 via the terminals P1 and P2. A power supply (not shown) such as an AC adapter or the like is connected to the terminals P3 and P4. The battery pack 7 is charged by the secondary battery charger 6. The result of a differential voltage measurement at its charge can be obtained by the differential voltage amplifier circuit section 1.

Thus, since the result of the high-accuracy differential voltage measurement can be obtained by the differential voltage amplifier circuit section 1, the secondary battery charger 6 is capable of measuring high-accuracy charge and discharge currents. It is thus possible to measure a more accurate battery remaining capacity.

Incidentally, the present invention is not limited to the illustrative embodiments. It is needless to say that various changes and modifications can be made within the scope not departing from the gist of the present invention. The scope of utilization of the present invention is not limited to the secondary battery pack and the secondary battery charger. It is needless to say that the present invention can be used in an apparatus that needs to measure a small voltage.

According to the present invention, as is apparent from the above description, a differential voltage amplifier circuit can be provided which is capable of canceling an input offset voltage of a differential amplifier to thereby prevent narrowing of an input voltage allowable range, making unnecessary the calculation of correction by an MPU or the like, reducing an influence due to a change in temperature and performing high-accuracy detection of a differential voltage.

What is claimed is:

1. A differential voltage amplifier circuit provided with a first differential amplifier, comprising:
    a first switch section which short-circuits between input paths corresponding to a first input path from a first input terminal to the first differential amplifier and a second input path from a second input terminal to the first differential amplifier;
    a voltage holder which holds a short-circuit output voltage outputted from the first differential amplifier upon a short-circuit between the input paths;
    a second switch section which connects an output terminal of the first differential amplifier and the voltage holder upon holding the short-circuit output voltage;
    a subtraction circuit section which subtracts the short-circuit output voltage held in the voltage holder from a first reference voltage; and
    a third switch section which supplies the first reference voltage to a bias voltage terminal for setting a bias point of an input voltage of the first differential amplifier upon the short-circuit between the input paths and supplies an output of the subtraction circuit section as a second reference voltage upon differential voltage amplification.

2. The differential voltage amplifier circuit according to claim 1, further comprising:
    a first resistor connected to the first input terminal;
    a second resistor connected to the second input terminal;
    a third resistor connected to the bias voltage terminal; and
    a fourth resistor connected to the output terminal of the first differential amplifier,
    wherein a connecting point of the first resistor and the third resistor is connected to a non-inversion input terminal of the first differential amplifier, and a connecting point of the second resistor and the fourth resistor is connected to an inversion input terminal of the first differential amplifier, and
    whrein the resistance values of the first resistor are equal to those of the second resistor, and the resistance values of the third resistor are equal to those of the fourth resistor.

3. The differential voltage amplifier circuit according to claim 1, wherein the subtraction circuit section comprises:
    a second differential amplifier;
    a fifth resistor connected to an output terminal of the second differential amplifier; and
    a sixth resistor connected to the voltage holder,
    wherein a connecting point of the fifth resistor and the sixth resistor is connected to an inversion input terminal of the second differential amplifier, and the first reference voltage is inputted to a non-inversion input terminal of the second differential amplifier, and
    wherein the resistance values of the fifth resistor and the sixth resistor are equal to each other.

4. The differential voltage amplifier circuit according to claim 1, wherein the short-circuit between the input paths of the first differential amplifier is performed for each predetermined cycle.

5. The differential voltage amplifier circuit according to claim 1, wherein the voltage holder comprises a capacitor.

6. The differential voltage amplifier circuit according to claim 1, wherein an input switch section is provided at at least either a path extending from the first input terminal to the first switch section, of the first input path or a path extending from the second input terminal to the first switch section, of the second input path, and
    wherein the input switch section is brought into a connected state upon the differential voltage amplification and brought into a non-connected state upon the short-circuit between the input paths.

7. The differential voltage amplifier circuit according to claim 2, wherein a first buffer amplifier is provided at a path from the third switch section to the third resistor.

8. The differential voltage amplifier circuit according to claim 7, wherein a second buffer amplifier is provided at a path from the first input terminal to the first resistor, and a third buffer amplifier is provided at a path from the second input terminal to the second resistor.

9. The differential voltage amplifier circuit according to claim 8, wherein a fourth buffer amplifier is provided at a path from the voltage holder to the sixth resistor.

10. The differential voltage amplifier circuit according to claim 7, wherein a fourth switch section is provided at a path through which the first reference voltage is inputted to the non-inversion input terminal of the second differential amplifier,
    wherein the fourth switch section is brought into a connected state upon the differential voltage amplification and brought into a non-connected state upon the short-circuit between the input paths.

11. A secondary battery pack comprising:
    a sense section which detects charge and discharge currents; and
    a differential voltage amplifier circuit as defined in claim 1,
    wherein the differential voltage amplifier circuit amplifies a differential voltage outputted from the sense section in accordance with the charge and discharge currents.

12. A secondary battery charger comprising:
    a sense section which detects charge and discharge currents; and
    a differential voltage amplifier circuit as defined in claim 1,
    wherein the differential voltage amplifier circuit amplifies a differential voltage outputted from the sense section in accordance with the charge and discharge currents.

13. A differential voltage amplifier circuit provided with a differential amplifier, comprising:
    a voltage holder which holds a short-circuit output voltage outputted from the differential amplifier where a short circuit is developed between two input paths to the differential amplifier; and
    a bias voltage setting section which supplies a first reference voltage to a bias voltage terminal, to which a bias point of an input voltage of the differential amplifier is set, upon the short-circuit between the input paths and supplies a voltage corresponding to a difference between the short-circuit output voltage held in the voltage holder and the first reference voltage upon differential voltage amplification.

* * * * *